(12) United States Patent
Lomayev et al.

(10) Patent No.: US 10,530,452 B2
(45) Date of Patent: Jan. 7, 2020

(54) GOLAY SEQUENCES FOR WIRELESS NETWORKS

(71) Applicant: Intel IP Corporation, Santa Clara, CA (US)

(72) Inventors: Artyom Lomayev, Nizhny Novgorod (RU); Yaroslav P. Gagiev, Nizhny Novgorod (RU); Alexander Maltsev, Nizhny Novgorod (RU); Assaf Kasher, Haifa (IL); Michael Genossar, Modiin (IL); Carlos Cordeiro, Portland, OR (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/043,744

(22) Filed: Jul. 24, 2018

(65) Prior Publication Data

US 2019/0089440 A1    Mar. 21, 2019

Related U.S. Application Data

(63) Continuation of application No. 15/280,635, filed on Sep. 29, 2016, now Pat. No. 10,075,224.

(Continued)

(51) Int. Cl.
*H04B 7/06* (2006.01)
*H03M 13/15* (2006.01)
(Continued)

(52) U.S. Cl.
CPC ...... *H04B 7/0634* (2013.01); *H03M 13/1505* (2013.01); *H04B 7/0413* (2013.01);
(Continued)

(58) Field of Classification Search
CPC .. H03M 13/1505; H04J 13/0014; H04J 13/12; H04J 13/14; H04B 7/0413;
(Continued)

(56) References Cited

U.S. PATENT DOCUMENTS

| 10,044,635 B2 * | 8/2018 | Eitan | H04L 47/80 |
| 2008/0112501 A1 * | 5/2008 | Diaz Fuente | H04L 25/022 375/285 |

(Continued)

OTHER PUBLICATIONS

IEEE 802.11ad Part 11: Wireless LAN Medium Access Control (MAC) and Physical Layer (PHY) Specifications Amendment 3: Enhancements for Very High Throughput in the 60 GHz Band, Oct. 2012 pp. 1-598.*

*Primary Examiner* — Sophia Vlahos
(74) *Attorney, Agent, or Firm* — Eversheds Sutherland (US) LLP

(57) ABSTRACT

This disclosure describes the generation and implementation of Golay sequences and Golay Sequence Sets (GSSs) for channel estimation in wireless networks. In one embodiment, this disclosure describes an extension of the Golay sequences Ga and Gb defined in various legacy standards to GSSs. In various embodiments, the disclosed GSSs can include a number of Golay complementary pairs (e.g., Ga and Gb). In one embodiment, the disclosed Golay complementary pairs can meet various predetermined design rules and can be used to define enhanced directional multi-gigabit (EDMG) short training field (STF) and/or channel estimation field (CEF) fields for multiple-input and multiple-output (MIMO) transmission.

20 Claims, 11 Drawing Sheets

Related U.S. Application Data

(60) Provisional application No. 62/331,644, filed on May 4, 2016.

(51) Int. Cl.

| | | |
|---|---|---|
| *H04B 7/0413* | (2017.01) | |
| *H04W 72/04* | (2009.01) | |
| *H04L 27/26* | (2006.01) | |
| *H04J 13/00* | (2011.01) | |
| *H04L 5/00* | (2006.01) | |
| *H04J 13/12* | (2011.01) | |
| *H04J 13/14* | (2011.01) | |

(52) U.S. Cl.
CPC ........ *H04J 13/0014* (2013.01); *H04L 5/0048* (2013.01); *H04L 27/2602* (2013.01); *H04L 27/2613* (2013.01); *H04W 72/0446* (2013.01); *H04J 13/12* (2013.01); *H04J 13/14* (2013.01)

(58) Field of Classification Search
CPC . H04B 7/0634; H04L 5/0048; H04L 27/2602; H04L 27/2613; H04W 72/0446
See application file for complete search history.

(56) References Cited

U.S. PATENT DOCUMENTS

| | | | |
|---|---|---|---|
| 2012/0207231 A1* | 8/2012 | Zhang | H04L 27/2613 375/260 |
| 2016/0308594 A1* | 10/2016 | Sanderovich | H04B 7/0613 |
| 2018/0262366 A1* | 9/2018 | Sahin | H04B 7/0452 |
| 2018/0302245 A1* | 10/2018 | Oh | H04L 25/02 |

\* cited by examiner

| Stream # | W vector | Output A | Output B |
|---|---|---|---|
| 1 | [-1,-1,-1,+1,-1,-1]* | Ga | Gb |
| 2 | [+1,-1,-1,-1,+1,-1,-1] | Ga | Gb |
| 3 | [-1,-1,-1,+1,-1,-1,+1] | Ga | Gb |
| 4 | [+1,-1,+1,-1,-1,-1,+1] | Ga | Gb |
| 5 | [-1,+1,-1,+1,-1,+1,+1] | Ga | Gb |
| 6 | [+1,-1,-1,+1,-1,+1,+1] | Ga | Gb |
| 7 | [-1,-1,+1,+1,+1,+1,-1] | Ga | Gb |
| 8 | [+1,+1,-1,-1,+1,-1] | Ga | Gb |
| 9 | [-1,+1,-1,-1,-1,-1] | Ga | Gb |
| 10 | [+1,-1,+1,-1,-1,+1] | Ga | Gb |
| 11 | [-1,+1,-1,+1,-1,-1] | Ga | Gb |
| 12 | [+1,-1,+1,-1,-1,+1] | Ga | Gb |
| 13 | [-1,-1,-1,+1,+1,+1] | Ga | Gb |
| 14 | [+1,+1,-1,+1,+1,-1] | Ga | Gb |
| 15 | [-1,+1,+1,-1,-1,-1] | Ga | Gb |
| 16 | [+1,-1,+1,-1,-1,+1] | Ga | Gb |

FIG. 3

| Stream # | W vector | Output A | Output B |
|---|---|---|---|
| 1 | [-1,-1,-1,-1,+1,-1,-1,+1]* | Ga | Gb |
| 2 | [+1,-1,-1,-1,-1,+1,-1,+1] | Ga | Gb |
| 3 | [-1,-1,-1,+1,-1,-1,+1,-1] | Ga | Gb |
| 4 | [+1,-1,-1,+1,+1,-1,+1,-1] | Ga | Gb |
| 5 | [-1,-1,+1,-1,-1,+1,+1,-1] | Ga | Gb |
| 6 | [+1,-1,+1,-1,+1,+1,+1,-1] | Ga | Gb |
| 7 | [-1,-1,+1,+1,+1,-1,-1,-1] | Ga | Gb |
| 8 | [+1,-1,+1,+1,-1,-1,-1,-1] | Ga | Gb |
| 9 | [-1,+1,-1,-1,+1,-1,+1,+1] | Ga | Gb |
| 10 | [+1,+1,-1,-1,-1,-1,+1,+1] | Ga | Gb |
| 11 | [-1,+1,-1,+1,-1,+1,-1,-1] | Ga | Gb |
| 12 | [+1,+1,-1,+1,+1,+1,-1,-1] | Ga | Gb |
| 13 | [-1,+1,+1,-1,-1,-1,-1,+1] | Ga | Gb |
| 14 | [+1,+1,+1,-1,+1,-1,-1,+1] | Ga | Gb |
| 15 | [-1,+1,+1,+1,+1,+1,+1,+1] | Ga | Gb |
| 16 | [+1,+1,+1,+1,-1,+1,+1,+1] | Ga | Gb |

FIG. 4

| Stream # | W vector | Output A | Output B |
|---|---|---|---|
| 1 | [-1,-1,-1,-1,+1,-1,-1,-1,+1,+1]* | Ga | Gb |
| 2 | [+1,-1,-1,-1,+1,-1,-1,-1,+1,+1] | Ga | Gb |
| 3 | [-1,+1,-1,-1,+1,-1,-1,-1,+1,-1] | Ga | Gb |
| 4 | [+1,+1,-1,-1,-1,-1,-1,-1,-1,-1] | Ga | Gb |
| 5 | [-1,-1,+1,-1,-1,-1,+1,-1,-1,-1] | Ga | Gb |
| 6 | [+1,-1,+1,-1,-1,+1,-1,-1,-1,+1] | Ga | Gb |
| 7 | [-1,+1,+1,-1,+1,+1,-1,-1,-1,+1] | Ga | Gb |
| 8 | [+1,+1,+1,-1,+1,-1,+1,+1,-1,-1] | Ga | Gb |
| 9 | [-1,-1,-1,+1,-1,-1,+1,+1,+1,-1] | Ga | Gb |
| 10 | [+1,-1,-1,+1,-1,+1,-1,+1,-1,-1] | Ga | Gb |
| 11 | [-1,+1,-1,+1,+1,+1,-1,+1,-1,-1] | Ga | Gb |
| 12 | [+1,+1,-1,+1,+1,-1,+1,-1,+1,-1] | Ga | Gb |
| 13 | [-1,-1,+1,+1,-1,-1,-1,-1,-1,-1] | Ga | Gb |
| 14 | [+1,-1,+1,+1,-1,+1,-1,-1,+1,-1] | Ga | Gb |
| 15 | [-1,+1,+1,+1,-1,-1,-1,+1,-1,-1] | Ga | Gb |
| 16 | [+1,+1,+1,+1,-1,-1,+1,-1,-1,+1] | Ga | Gb |

FIG. 5A

| Stream # | W vector | Output A | Output B |
|---|---|---|---|
| 1 | [-1,-1,-1,+1,-1,-1,-1,+1] | Ga | Gb |
| 2 | [+1,-1,-1,+1,+1,-1,-1,+1] | Ga | Gb |
| 3 | [-1,-1,-1,-1,-1,-1,-1,+1] | Ga | Gb |
| 4 | [+1,-1,-1,-1,+1,-1,-1,+1] | Ga | Gb |
| 5 | [-1,-1,-1,+1,-1,-1,-1,+1] | Ga | Gb |
| 6 | [+1,-1,-1,+1,+1,-1,-1,+1] | Ga | Gb |
| 7 | [-1,-1,-1,+1,+1,-1,-1,+1] | Ga | Gb |
| 8 | [-1,-1,-2,+1,-1,-1,-2,+1] | Ga | Gb |
| 9 | [-1,-1,+1,-1,-1,-1,+1,+1] | Ga | Gb |
| 10 | [+1,-1,+1,-2,+1,-1,+1,+1] | Ga | Gb |
| 11 | [-1,-1,+1,-1,+1,-1,+1,+1] | Ga | Gb |
| 12 | [+1,-1,+1,-2,+1,-1,+1,+1] | Ga | Gb |
| 13 | [-1,-1,+1,-1,-1,-1,+1,+1] | Ga | Gb |
| 14 | [-1,-1,+1,+1,+1,-1,-1,+1] | Ga | Gb |
| 15 | [-1,-1,+1,+1,-1,-1,-1,+1] | Ga | Gb |
| 16 | [+1,-1,+1,+1,-1,-1,-1,+1] | Ga | Gb |

FIG. 5B

GOLAY SEQUENCES FOR WIRELESS NETWORKS

RELATED APPLICATIONS

This application is a continuation of U.S. Non-provisional application Ser. No. 15/280,635, filed Sep. 29, 2016, which claims the benefit of U.S. Provisional Application No. 62/331,644, filed May 4, 2016, the disclosures of which are incorporated herein by reference in their entireties.

TECHNICAL FIELD

This disclosure generally relates to systems, methods, and devices for wireless communications and, more particularly, systems, methods, and devices to Golay sequences for wireless communication.

BACKGROUND

IEEE 802.11ay can refer to a standard in the mmWave (60 GHz) band, which can be related to IEEE 802.11ad standard, also referred to as WiGig. IEEE 802.11ay describes standards that can increase the transmission data rate in wireless networks, for example, by applying Multiple Input Multiple Output (MIMO) techniques.

BRIEF DESCRIPTION OF THE DRAWINGS

FIG. 3 shows an example table 300 that represents a GSS for N=128 and a delay vector D=[1, 2, 4, 8, 16, 32, 64], in accordance with example embodiments of the disclosure.

FIG. 4 shows an example table 400 that represents the GSS for N=256 and delay vector D=[1, 2, 4, 8, 16, 32, 64, 128], in accordance with example embodiments of the disclosure.

FIG. 5A shows a first example table 500 that represents the GSS for N=512 and delay vector D=[1, 2, 4, 8, 16, 32, 64, 128, 256], in accordance with example embodiments of the disclosure.

FIG. 5B shows a second example table 501 that represents the GSS for N=512 and delay vector D=[1, 2, 4, 8, 16, 32, 64, 128, 256], in accordance with example embodiments of the disclosure.

DETAILED DESCRIPTION

Figure 1:
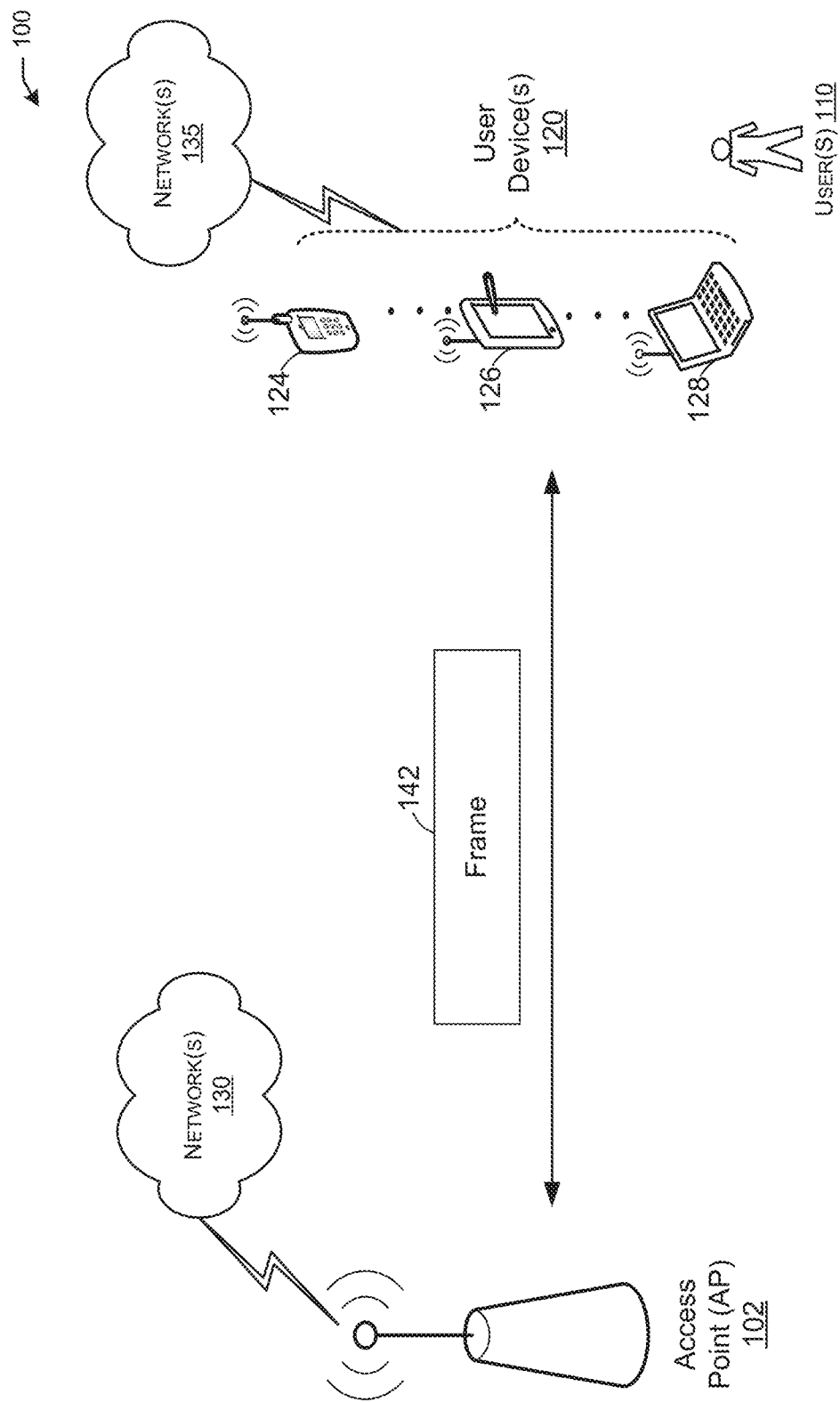
FIG. 1 shows an exemplary network environment in accordance with one or more example embodiments of the disclosure.

Example embodiments described herein provide certain systems, methods, and devices, for providing signaling information to Wi-Fi devices in various Wi-Fi networks, including, but not limited to, WiGig.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In wireless networks, signals can be sent and received between transmitters and receivers through one or more channels. Such channels can induce distortions in the signal transmitted and received. To handle the distortions and maintain signal integrity, the characteristics of the one or more channels, at a given time, can be determined to estimate the induced distortion to the signals transmitted and received by the channels, that is, performing channel estimation.

One technique for performing channel estimation in wireless systems includes transmitting, by a transmitter, signals with predetermined sequences and comparing the signals received in a receiver. For example, auto-correlation and/or cross-correlation can be performed on the received with predetermined sequences to estimate the channel characteristics. Since the sequences of the transmitted signals are known to the receiver, the results of the correlation operation can yield the estimation of the channel characteristics, for example, the impulse response of the channel.

For efficient channel estimation, sequences with good autocorrelation properties, such as complementary sequences (for example, Golay complementary sequences), can be transmitted by the transmitter and auto-correlated by the receiver, for example, in one or more channel estimation fields (CEF) of data packets that contain the transmitted signal. One property of Golay complementary sequences is that they can have a sum of autocorrelations that equals the delta function.

Example embodiments of the present disclosure relate to systems, methods, and devices for transmitting device can include a Golay generator that can generate Golay complementary sequences (Ga, Gb) which are can be modulated and transmitted, for example, using a modulator. The modulator may be, for example, an Orthogonal Frequency Division Multiplexing (OFDM) modulator, a single carrier (SC) modulator, and the like. In one embodiment, a Golay generator can generate the complementary sequences.

The signals including the Golay sequences can be received at a receiving device. Because of the channel conditions, the received Golay sequences Ga', Gb' may be different than the original Golay sequences Ga, Gb. However, a Golay correlator can correlate the received sequences. The received signal S' (including sequences Ga',Gb') can be filtered using a filter. Then, the cross-correlation results can indicate the channel estimation as provided by the Golay correlator. Further, in various embodiments, an equalizer can equalizes the received signals S' based on the output of the Golay correlator. The equalized signals can be de-modulated using a demodulator to obtain an estimate of the originally transmitted signal.

In one embodiment, a wireless network used in connection with the systems and methods of this disclosure may also include one or more legacy devices. Legacy devices can include those devices compliant with an earlier version of a given standard, but can reside in the same network as devices compliant with a later version of the standard. In one embodiment, disclosed herein are systems, methods, and devices that can permit legacy devices to communicate with and perform channel estimation with newer version devices. Thus, newer devices or components using current standards can have backward compatibility with legacy devices within a network. These devices and components can be adaptable to legacy standards and current standards when transmitting information within the network. For example, backward compatibility with legacy devices may be enabled at either a physical (PHY) layer or a Media-Specific Access Control (MAC) layer. At the PHY layer, backward compatibility can be achieved, for example, by re-using the PHY preamble from a previous standard. Legacy devices may decode the preamble portion of the signals, which may provide sufficient information for determining the channel estimation or other relevant information for the transmission and reception of the signals. At the MAC layer, backward compatibility with legacy devices may be enabled by having devices that are compliant with a newer version of the standard transmit additional frames using modes or data rates that are employed by legacy devices.

Various legacy standards can use Golay complementary sequences (which can be denoted as Ga and Gb) to define short training fields (STFs) and channel estimation fields (CEFs) associated with a preamble of a data packet. For example, the STF field can have multiple uses in wireless networks, including, but not limited to, packet detection, carrier frequency offset estimation, noise power estimation, synchronization, automatic gain control (AGC) setup and other possible signal estimations. As another example, the CEF can be used for the channel estimation in the time or the frequency domain. In the time domain, a Golay correlator can be used to perform matched filter operations without requiring the implementation of multipliers.

In various embodiments, this disclosure describes the generation and implementation of Golay sequences and Golay Sequence Sets (GSSs) for channel estimation in wireless networks. In one embodiment, this disclosure describes an extension of the Golay sequences Ga and Gb defined in various legacy standards to GSSs.

In various embodiments, the disclosed GSSs can include a number of Golay complementary pairs (for example, Ga and Gb). In one embodiment, the disclosed Golay complementary pairs can meet various predetermined rules and can be used to define enhanced directional multi-gigabit (EDMG) STF and CEF fields for multiple-input and multiple-output (MIMO) transmission.

In various embodiments, a GSS generation system may produce complementary sequences of an arbitrary length. In one embodiment, a GSS for a sequence can be defined in terms of delay vector and/or a weight vector. Further, in another embodiment, the delay vector and/or a weight vector can be described in accordance with IEEE 802.11ad standards. The Ga and Gb sequences can be generated using these vectors, for example, by using Golay generator structures. Furthermore, the delay vector and the weight vector can be based at least in part on the (Ga, Gb) complementary pair.

FIG. 1 is a diagram illustrating an example network environment, according to some example embodiments of the present disclosure. Wireless network 100 may include one or more devices 120 and one or more access point(s) (AP) 102, which may communicate in accordance with IEEE 802.11 communication standards, including IEEE 802.11ad and/or IEEE 802.11ay. The device(s) 120 may be mobile devices that are non-stationary and do not have fixed locations.

The user device(s) 120 (e.g., 124, 126, or 128) may include any suitable processor-driven user device including, but not limited to, a desktop user device, a laptop user device, a server, a router, a switch, an access point, a smartphone, a tablet, wearable wireless device (e.g., bracelet, watch, glasses, ring, etc.) and so forth. In some embodiments, the user devices 120 and AP 102 may include one or more computer systems similar to that of the functional diagram of FIG. 7 and/or the example machine/system of FIG. 8 to be discussed further.

Returning to FIG. 1, any of the user device(s) 120 (e.g., user devices 124, 126, 128), and AP 102 may be configured to communicate with each other via one or more communications networks 130 and/or 135, wirelessly or wired. Any of the communications networks 130 and/or 135 may include, but not limited to, any one of a combination of different types of suitable communications networks such as, for example, broadcasting networks, cable networks, public networks (e.g., the Internet), private networks, wireless networks, cellular networks, or any other suitable private and/or public networks. Further, any of the communications networks 130 and/or 135 may have any suitable communication range associated therewith and may include, for example, global networks (e.g., the Internet), metropolitan area networks (MANs), wide area networks (WANs), local area networks (LANs), or personal area networks (PANs). In addition, any of the communications networks 130 and/or 135 may include any type of medium over which network traffic may be carried including, but not limited to, coaxial cable, twisted-pair wire, optical fiber, a hybrid fiber coaxial (HFC) medium, microwave terrestrial transceivers, radio frequency communication mediums, white space communication mediums, ultra-high frequency communication mediums, satellite communication mediums, or any combination thereof.

Any of the user device(s) 120 (e.g., user devices 124, 126, 128), and AP 102 may include one or more communications antennas. The one or more communications antennas may be any suitable type of antennas corresponding to the communications protocols used by the user device(s) 120 (e.g., user devices 124, 126 and 128), and AP 102. Some non-limiting examples of suitable communications antennas include Wi-Fi antennas, Institute of Electrical and Electronics Engineers (IEEE) 802.11 family of standards compatible antennas, directional antennas, non-directional antennas, dipole antennas, folded dipole antennas, patch antennas, multiple-input multiple-output (MIMO) antennas, omnidirectional antennas, quasi-omnidirectional antennas, or the like. The one or more communications antennas may be communicatively coupled to a radio component to transmit and/or receive signals, such as communications signals to and/or from the user device(s) 120 (e.g., user devices 124, 126, 128), and/or AP 102.

Any of the user device(s) 120 (e.g., user devices 124, 126, 128), and AP 102 may be configured to perform directional transmission and/or directional reception in conjunction with wirelessly communicating in a wireless network. Any of the user device(s) 120 (e.g., user devices 124, 126, 128), and AP 102 may be configured to perform such directional transmission and/or reception using a set of multiple antenna arrays (e.g., DMG antenna arrays or the like). Each of the multiple antenna arrays may be used for transmission and/or reception in a particular respective direction or range of directions. Any of the user device(s) 120 (e.g., user devices 124, 126, 128), and AP 102 may be configured to perform any given directional transmission towards one or more defined transmit sectors. Any of the user device(s) 120 (e.g., user devices 124, 126, 128), and AP 102 may be configured to perform any given directional reception from one or more defined receive sectors.

MIMO beamforming in a wireless network may be accomplished using RF beamforming and/or digital beamforming. In some embodiments, in performing a given MIMO transmission, user devices 120 (e.g., user devices 124, 126, 128), and/or AP 102 may be configured to use all or a subset of its one or more communications antennas to perform MIMO beamforming.

Any of the user devices 120 (e.g., user devices 124, 126, 128), and AP 102 may include any suitable radio and/or transceiver for transmitting and/or receiving radio frequency (RF) signals in the bandwidth and/or channels corresponding to the communications protocols utilized by any of the user device(s) 120 (e.g., user devices 124, 126, 128), and AP 102 to communicate with each other. The radio components may include hardware and/or software to modulate and/or demodulate communications signals according to pre-established transmission protocols. The radio components may further have hardware and/or software instructions to communicate via one or more Wi-Fi and/or Wi-Fi direct protocols, as standardized by the Institute of Electrical and Electronics Engineers (IEEE) 802.11 standards. In certain example embodiments, the radio component, in cooperation with the communications antennas, may be configured to communicate via 2.4 GHz channels (e.g. 802.11b, 802.11g, 802.11n, 802.11ax), 5 GHz channels (e.g. 802.11n, 802.11ac, 802.11ax), or 60 GHZ channels (e.g. 802.11ad and/or 802.11ay). In some embodiments, non-Wi-Fi protocols may be used for communications between devices, such as Bluetooth, dedicated short-range communication (DSRC), Ultra-High Frequency (UHF) (e.g., IEEE 802.11af, IEEE 802.22), white band frequency (e.g., white spaces), or other packetized radio communications. The radio component may include any known receiver and baseband suitable for communicating via the communications protocols. The radio component may further include a low noise amplifier (LNA), additional signal amplifiers, an analog-to-digital (A/D) converter, one or more buffers, and digital baseband.

Typically, when an AP (e.g., AP 102) establishes communication with one or more user devices 120 (e.g., user devices 124, 126, and/or 128), the AP may communicate in the downlink direction by sending data frames (e.g., 142); the frames may include Golay sequences as described in this disclosure, including one or more short training fields (STFs). In one embodiment, the Golay sequences can be used for performing channel estimation. The data frames may be preceded by one or more preambles that may be part of one or more headers. These preambles may be used to allow the user device to detect a new incoming data frame from the AP. A preamble may be a signal used in network communications to synchronize transmission timing between two or more devices (e.g., between the APs and user devices).

Channel state information (CSI) can refer to known channel properties of a communication link. This information describes how a signal propagates from the transmitter to the receiver and represents the combined effect of, for example, scattering, fading, and power decay with distance. The CSI can make it possible to adapt transmissions to current channel conditions, which can be important for achieving reliable communication with high data rates in multi-antenna systems. In various embodiments, this disclosure describes Golay sequences and Golay Sequence Sets (GSSs) to be used for channel estimation and extracting of CSI.

Various legacy standards, for example, the IEEE 802.11ad standard, can use Golay complementary sequences (which can be denoted as Ga and Gb) to define short training fields (STFs) and channel estimation fields (CEFs) associated with a preamble of a data packet. For example, the STF field can have multiple uses in wireless networks, including, but not limited to, packet detection, carrier frequency offset estimation, noise power estimation, synchronization, automatic gain control (AGC) setup and other possible signal estimations. As another example, the CEF can be used for the channel estimation in the time or the frequency domain. In the time domain, a Golay correlator can be used to perform matched filter operations without requiring the implementation of multipliers.

In various embodiments, this disclosure describes the generation and implementation of Golay sequences and Golay Sequence Sets (GSSs) for channel estimation in wireless networks. In one embodiment, this disclosure describes an extension of the Golay sequences Ga and Gb defined in various legacy standards (for example, the legacy IEEE 802.11ad standard) to GSSs.

In various embodiments, the disclosed GSSs can include a number of Golay complementary pairs (for example, Ga and Gb). In one embodiment, the disclosed Golay complementary pairs can meet various predetermined rules and can be used to define enhanced directional multi-gigabit (EDMG) STF and CEF fields for multiple-input and multiple-output (MIMO) transmission. The embodiments disclosed herein can be associated with various communication standards, for example, with IEEE 802.11ay standard. In one embodiment, the GSSs described in this disclosure can be used in association with highly-directional antennas, for example, Phase Antenna Arrays (PAAs).

In various embodiments, this disclosure further describes GSS generation to produce complementary sequences of an arbitrary length. For example, a particular set of the sequences can be provided for complementary sequences of length N=128 and complementary sequences of length N=256. Furthermore, complementary sequences of length 512 can be used, in some embodiments, in channel bonded 2×, 3×, and 4× communications.

In one embodiment, a GSS for a sequence length of N=128, 256, and 512 can be defined in terms of delay vector denoted by D and/or a weight vector denoted by W. Further, in another embodiment, the delay vector denoted by D and/or a weight vector denoted by W can be described in accordance with IEEE 802.11ad standards. The Ga and Gb sequences can be generated using these vectors, for example, by using Golay generator structures. Furthermore, the delay vector D and the weight vector W can be based at least in part on the (Ga, Gb) complementary pair.

As discussed below, the first part of this disclosure describes design rules, requirements, and methods for GSS set generation and implementation. The second part of this disclosure describes a particular GSS for sequence lengths N=128, 256, and 512, which can be defined by various standards, for example, by IEEE 801.11ay standards. Moreover, the GSS can include, for example, 8 sequences corresponding to the number of streams defined for single user (SU) MIMO communication.

In one embodiment, a number of design rules on Golay Sequence Sets (GSSs) are disclosed. $Ga_i$ and $Gb_i$ can refer to a complementary Golay sequence pair of length N, where "i" can define the pair index in the GSS composed of M pairs, where M can define the GSS size. First, a complementary property can be defined. The complementary property can refer to the case where the sum of the autocorrelation functions of the Golay sequence pairs is equal to unity: $Ga_i \times Ga_i + Gb_i \times Gb_i = 1$, where symbol x can refer to a circular convolution operation.

Second, the design rules for the designed GSS are described as follows: (1) $Ga_i$ and $Gb_i$ can refer to a complementary Golay pair, for i=1:M. (2) The Golay sequences can be orthogonal to each other. For example, the scalar products $(Ga_i, Ga_j)=0$, $(Gb_i, Gb_j)=0$, $(Ga_i, Gb_j)=0$ for any $i \neq j$. Further, (3) each complementary pair in the set $(Ga_i, Gb_i)$ can have a Zero Cross Correlation (ZCC) counterpart, which can be denoted by $(Ga_j, Gb_j)$. For example, $Ga_i \times Ga_j + Gb_i \times Gb_j = 0$, where $i \neq j$. (4) The original Golay pair of length N as described in various legacy standards, for example, in the legacy IEEE. 802.11ad standard, can be a part of the designed set, and can be described as a core pair in the GSS. (5) The GSS can use a delay vector as defined in various legacy standards, for example, in the IEEE 802.11ad standard. For example, in case of N=128, D=[1, 2, 4, 8, 16, 32, 64] and different weight vectors W can be used to construct the GSS. (6) The number of +1/−1's in the GSS can be the same as in the original Golay sequences, Ga and Gb, described in various legacy standards, for example, in the legacy IEEE 802.11ad standard and/or core pairs of sequences. (7) Each complementary pair in the designed GSS can have similar characteristics including, but not limited to, autocorrelation and Peak to Total Power Ratio (PAPR) at the output of any shape filters. For example, a difference between each complementary pair in the designed GSS can have an autocorrelation and/or Peak to Total Power Ratio (PAPR) can be below a predetermined threshold. Further, in one embodiment, the GSS can be designed for sequence lengths corresponding to N=128. In one embodiment, the GSS can be designed for sequence lengths corresponding to N=256 and N=512 for bonded 2×, 3× and 4× channels.

Figure 2:
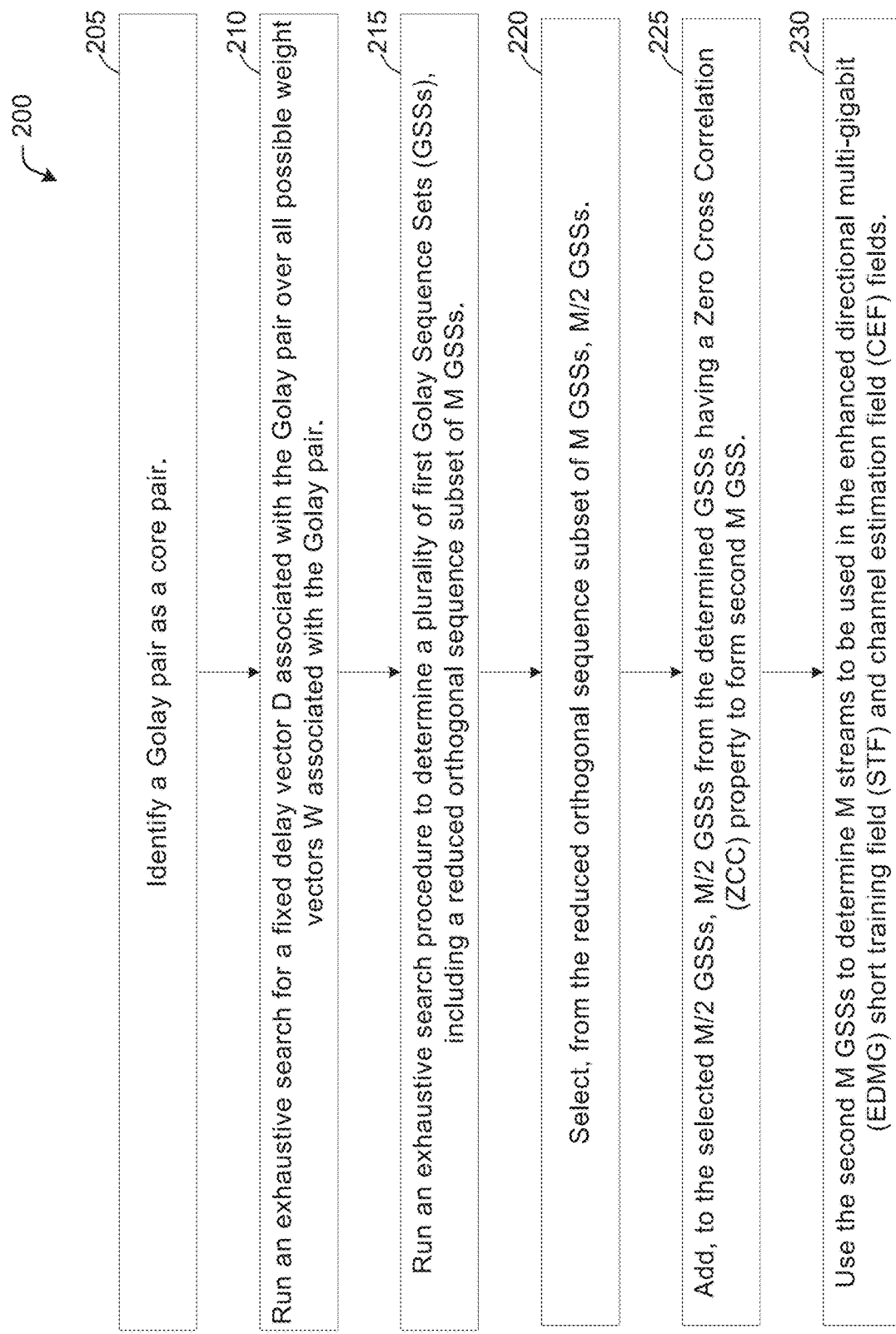
FIG. 2 shows a diagram of an example Golay set generation in accordance with one or more example embodiments of the disclosure.

FIG. 2 shows a diagram 200 of an example Golay set generation in accordance with example embodiments of the disclosure. At Block 205, a Golay pair can be generated, for example, by a transmitting device (such as an Access Point (AP) or a source (SRC) station (STA)), and/or identified as a core pair. For example, the original Golay pair can be generated and/or identified as described in accordance with the IEEE 802.11ad standards, as a core pair. For example, the Golay pair have an N=128, D=[1,2,4,8,16,32,64] and W=[−1,−1,−1,−1,+1,−1,−1]. At Block 210, an exhaustive search can be run over all possible vectors W associated with the Golay pair for a fixed delay vector D associated with the Golay pair. To illustrate, the total number of vectors in the search in this example (having a size of N and D and W vectors above) can have a value of $2^7-1$ (excluding the original sequence). At Block 215, an exhaustive search procedure can be used to determine a plurality of first GSSs, including a reduced orthogonal sequence subset of M GSSs. At Block 220, M/2 sequences can be selected from the reduced orthogonal sequence subset of M GSSs. This can be 4 sequences for the example having a size of N and D and W vectors above. In one embodiment, the selected GSSs can have the same number of +1/−1 elements. At Block 225, M/2 GSSs from the determined GSSs having a Zero Crossing Correlation (ZCC) property can be added to the selected M/2 GSSs to form a second M GSS. Lastly, at Block 230, the GSSs comprising M sequences can be used to define M streams to be used in the EDMG-STF/CEF.

FIG. 3 shows an example table 300 that represents a GSS for N=128 and a delay vector D=[1, 2, 4, 8, 16, 32, 64], in accordance with example embodiments of the disclosure. The first column in the table can represent the number of MIMO streams for which the complementary pair (Ga, Gb) can be used. The second column can define a weight vector W that can be used to generate the complementary pair. The third and fourth columns can identify which output (output A or output B) of the GSS generation methodology produces the Ga and Gb sequences. For example, row 302 of table 300 indicates that a GSS for N=128, vector D=[1, 2, 4, 8, 16, 32, 64], and a W vector of [+1,−1,−1,+1,−1,−1,+1], the method depicted in connection with FIG. 2 can produce the desired Ga and Gb sequences for use with 4 MIMO streams.

For single user (SU) MIMO transmission 8 streams can be used. For example, the first 8 W vectors in the table 300 of FIG. 3 define the sequences in such a SU-MIMO case. For MU-MIMO transmission the first 8 vectors in the table 300 of FIG. 3 define the sequences (similar to SU-MIMO). Alternatively or additionally, the 16 vectors in the table 400 shown in FIG. 4 can be used to define the sequences in such a MU-MIMO case (see relevant description below). The same usage of the first 8 W vectors for SU-MIMO and 16 W vectors for MU-MIMO can be provided for the sequences of length 256 and 512 described below.

In various embodiments, streams 1 and 2, 3, streams 4, 5 and 6, and streams 7 and 8 can have W vectors that can be different only in the first element. In one embodiment, corresponding complementary pairs (for example, (Ga1, Gb1) and (Ga2, Gb2)) can coincide for even elements and can differ for odd elements. In another embodiment, because the GSSs can be binary sequences, the odd index elements can have inverse signs. This property can ensure that (Ga1, Gb1) and (Ga2, Gb2) have the ZCC property described above. The same property can be valid for other pairs in the set.

FIG. 4 shows an example table 400 that represents the GSS for N=256 and delay vector D=[1, 2, 4, 8, 16, 32, 64, 128], in accordance with example embodiments of the disclosure. For example, row 402 of table 400 indicates that a GSS for N=256, vector D=[1, 2, 4, 8, 16, 32, 64, 128], and a W vector of [+1,−1,−1,+1,−1,−1,+1,−1], the method depicted in connection with FIG. 2 can produce the desired Ga and Gb sequences for use with 4 MIMO streams.

FIG. 5A shows a first example table 500 that represents the GSS for N=512 and delay vector D=[1, 2, 4, 8, 16, 32, 64, 128, 256], in accordance with example embodiments of the disclosure. For example, row 502 of table 500 indicates that a GSS for N=512, vector D=[1, 2, 4, 8, 16, 32, 64, 128, 256], and a W vector of [+1,−1,−1,−1,−1,−1,−1,−1, −1], the method depicted in connection with FIG. 2 can produce the desired Ga and Gb sequences for use with 4 MIMO streams.

FIG. 5B shows a second example table 501 that represents of the GSS for N=512 and delay vector D=[1, 2, 4, 8, 16, 32, 64, 128, 256], in accordance with example embodiments of the disclosure. For example, row 504 of table 501 indicates that a GSS for N=512, vector D=[1, 2, 4, 8, 16, 32, 64, 128, 256], and a W vector of [+1,−1,−1,+1,−1,−1,+1,−1, +1], the method depicted in connection with FIG. 2 can produce the desired Ga and Gb sequences for use with 4 MIMO streams.

As such, the GSSs described herein for the sequence lengths N=128, 256, and 512 shown in the preceding figures meet the requirements described in this disclosure.

Figure 6A:
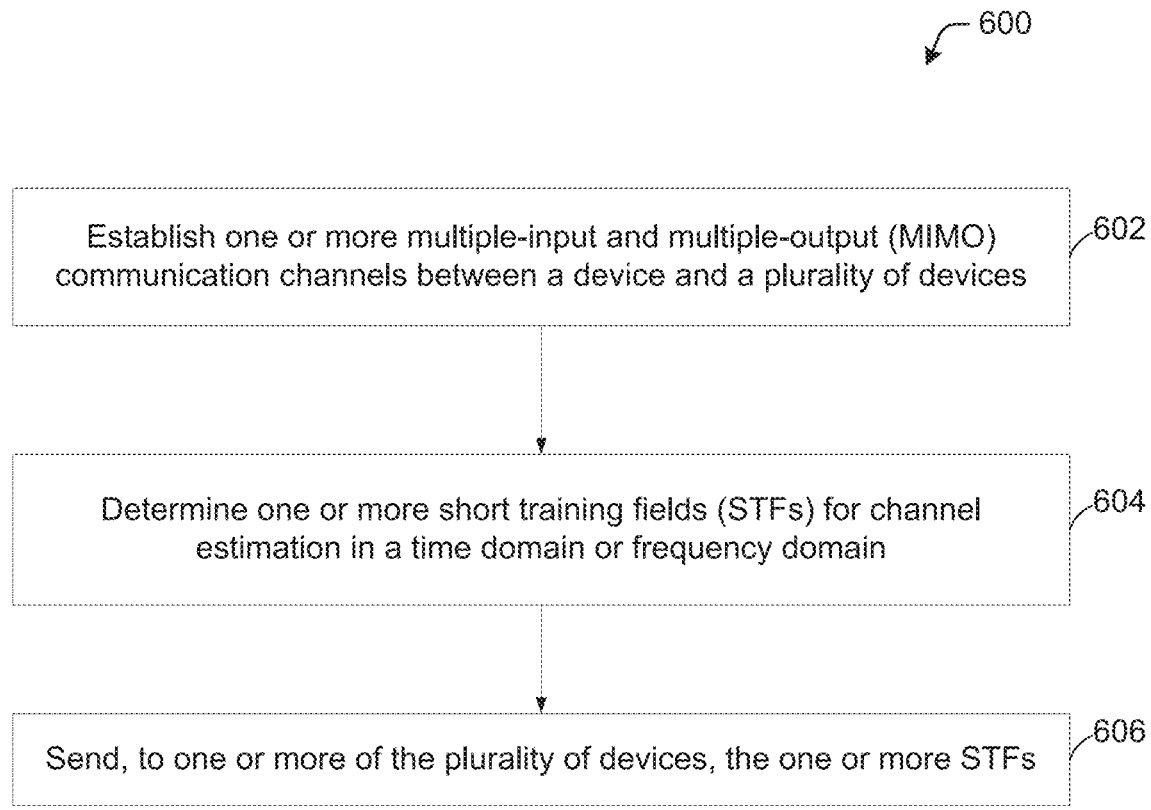
FIG. 6A illustrates a flow diagram of an illustrative process for Golay sequence generation, in accordance with one or more example embodiments of the present disclosure.

FIG. 6A illustrates a flow diagram of illustrative process 600 for an illustrative process for the generation and the use of the Golay sequences and/or the GSSs, in accordance with one or more example embodiments of the present disclosure.

At block 602, a device (e.g., the user device(s) 120 and/or the AP 102 of FIG. 1) may establish or determine to establish one or more multiple-input and multiple-output (MIMO) communication channels between a device and a plurality of devices. The establishment of the MIMO communications channels may first involve a determination of data by the device to send to one or more devices of the plurality of devices. This determination of the data to send may be made, for example, based on a user input to the device, a predetermined schedule of data transmissions on the network, changes in network conditions, and the like. The establishment of the MIMO communications channels may further involve the transmission of one or more data packets (for example, one or more Request to Send (RTS)) to notify the one or more devices of the plurality of devices to establish the communications channel. The establishment of the MIMO communications channels may be performed in accordance with one or more wireless and/or network standards.

At block 604, the device may determine one or more short training fields (STFs) for channel estimation in a time domain or frequency domain. In one embodiment, a Golay pair can be generated by the device and/or identified as a core pair. For example, the Golay pair can be generated and/or identified as described in accordance with the IEEE 802.11ad standards, as a core pair. For example, the Golay pair have an N=128, D=[1,2,4,8,16,32,64] and W=[4,−1,−1,−1,+1,−1,−1]. In another embodiment, an exhaustive search can be run over all possible vectors W associated with the Golay pair for a fixed delay vector D associated with the Golay pair. Further, an exhaustive search procedure can be used to determine a plurality of first GSSs, including a reduced orthogonal sequence subset of M GSSs. In one embodiment, M/2 sequences can be selected from the reduced orthogonal sequence subset of M GSSs. In another embodiment, M/2 GSSs from the determined GSSs having a zero crossing correlation property can be added to the selected M/2 GSSs to form a second M GSS. In one embodiment, the GSSs comprising M sequences can be used to define M streams to be used in the EDMG-STF/CEF.

At block 606, the device may send, to one or more of the plurality of devices, the one or more STFs. In one embodiment, the one or more STFs may be encapsulated in a data frame that is sent from the device to one or more of the plurality of devices. In another embodiment, one or more STFs may be sent in a header of the data frame. In one embodiment, the STFs may be sent at a predetermined time based at least in part on a predetermined schedule of communication between the devices of the network. In another embodiment, a first STF may be first sent by the device, a period of time may elapse, and the device may repeat some or all of the procedures described in connection with block 604, and resend second STFs. In one embodiment during, or after the transmission of the STFs, the device may receive information from the receiving device, indicative of a change to be performed by the transmitting device in sending data. For example, the information may indicate to change the number of streams of the MIMO communications channels, to increase and/or decrease the amount of data transmitted on one or more channels of the MIMO communications channels, to retransmit one or more packets of data, to send one or more packets of data at a predetermined time, and the like.

Figure 6B:
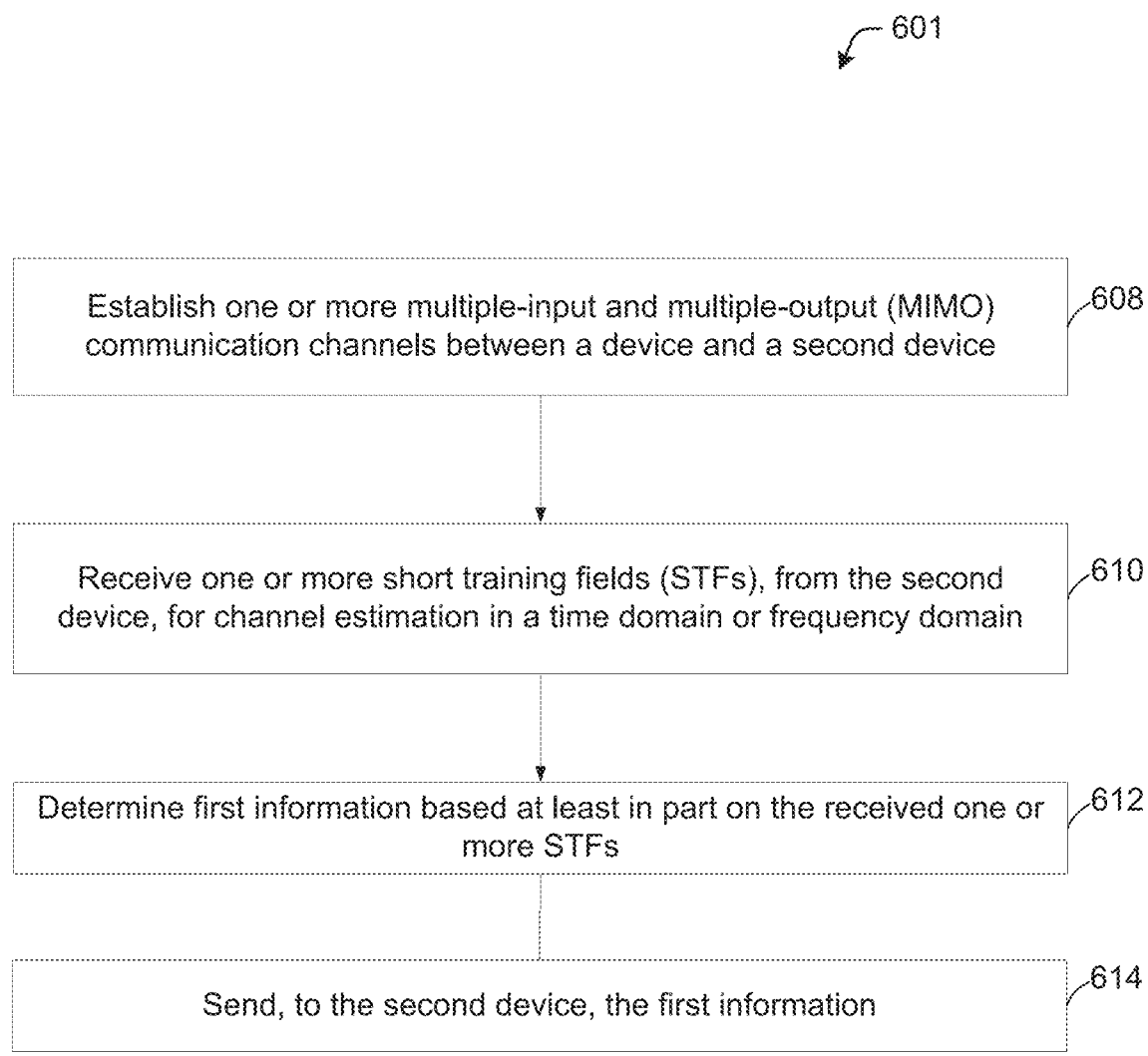
FIG. 6B illustrates a flow diagram of an illustrative process for Golay sequence generation, in accordance with one or more example embodiments of the present disclosure.

FIG. 6B illustrates a flow diagram of illustrative process 601 for the generation and the use of the Golay sequences and/or the GSSs, in accordance with one or more example embodiments of the present disclosure.

At block 608, a device (e.g., the user device(s) 120 and/or the AP 102 of FIG. 1) may the device may establish one or more multiple-input and multiple-output (MIMO) communication channels between a device and a second device. The establishment of the MIMO communications channels may first involve a determination of data by the device to send to the second device. This determination of the data to send may be made, for example, based on a user input to the device or the second device, a predetermined schedule of data transmissions on the network, changes in network conditions, and the like. The establishment of the MIMO communications channels may further involve the transmission of one or more data packets (for example, one or more Clear to Send (CTS)) to notify the second device of one or more conditions related to the establishment of the communications channels. The establishment of the MIMO communications channels may be performed in accordance with one or more wireless and/or network standards.

At block 610, the device may receive one or more short training fields (STFs), from the second device, for channel estimation in a time domain or frequency domain. In one embodiment, the one or more STFs may be encapsulated in a data frame. In another embodiment, one or more STFs may be sent in a header of the data frame. In one embodiment, the STFs may be sent at a predetermined time based at least in part on a predetermined schedule of communication between the devices of the network. In another embodiment, first STFs may be first received by the device, a period of time may elapse, and second STFs may be received by the device.

At block 612, the device may send, to the second device, first information based at least in part on the received one or more STFs. In one embodiment during, or after the reception of the first or second STFs, the device may determine the first information, the information indicative of a change to be performed by the transmitting device in sending data. For example, the first information may indicate to the second device to change the number of streams of the MIMO communications channels, to increase and/or decrease the amount of data transmitted on one or more channels of the MIMO communications channels, to retransmit one or more packets of data, to send one or more packets of data at a predetermined time, and the like.

Figure 6C:
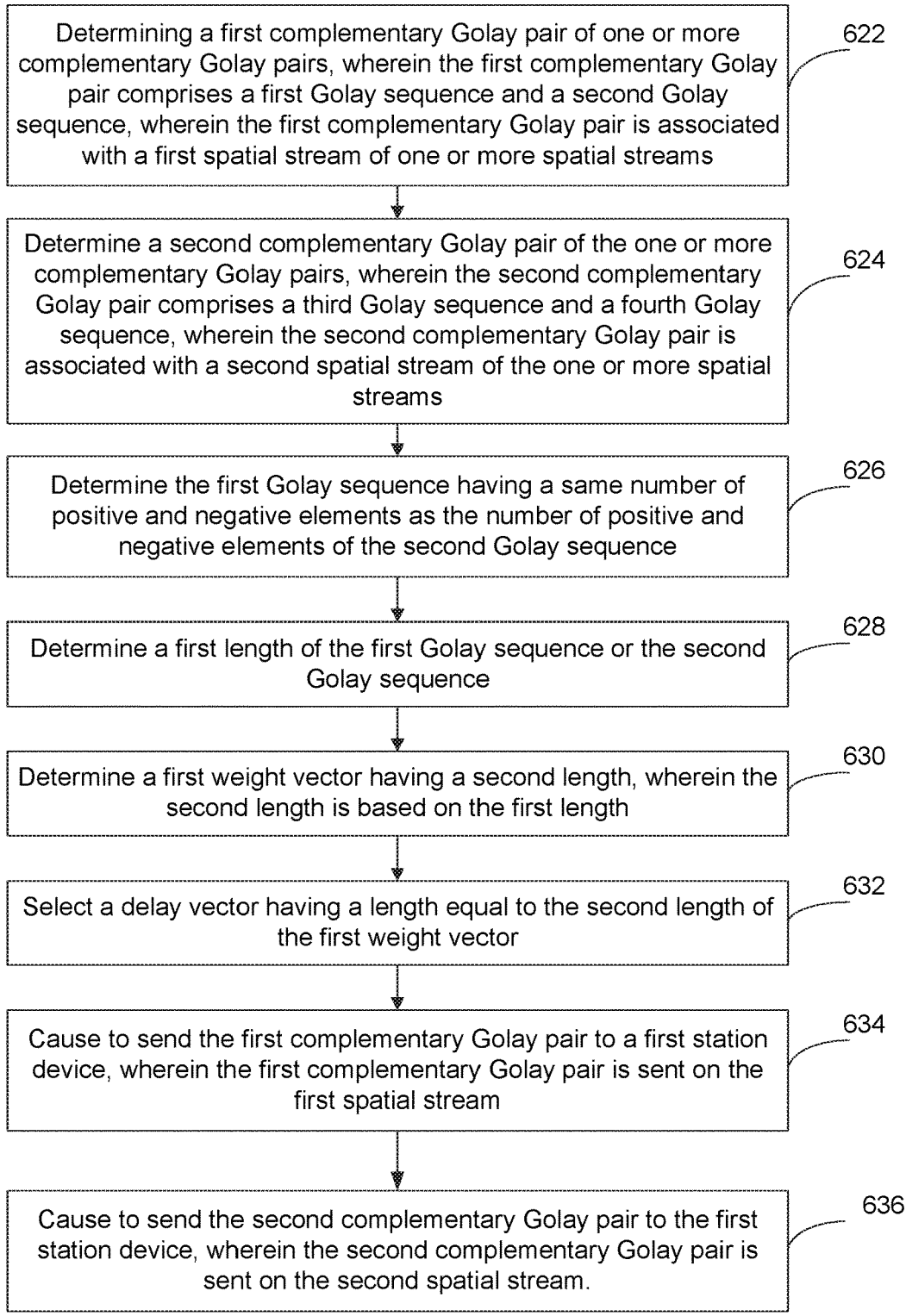
FIG. 6C illustrates a flow diagram of an illustrative process for Golay sequence generation, in accordance with one or more example embodiments of the present disclosure.

FIG. 6C illustrates a flow diagram of an illustrative process 620 for Golay sequence generation, in accordance with one or more example embodiments of the present disclosure.

At block 622, a device (e.g., the user device(s) 120 and/or the AP 102 of FIG. 1) may determine a first complementary Golay pair of complementary Golay pairs, wherein the first complementary Golay pair comprises a first Golay sequence and a second Golay sequence, wherein the first complementary Golay pair is associated with a first spatial stream of one or more spatial streams.

At block 624, the device may determine a second complementary Golay pair of the complementary Golay pairs, wherein the second complementary Golay pair comprises a third Golay sequence and a fourth Golay sequence, wherein the second complementary Golay pair is associated with a second spatial stream of the one or more spatial streams.

At block 626, the device may determine the first Golay sequence and the second Golay sequence have a same number of positive elements and negative elements, and wherein the first Golay sequence is orthogonal to the second Golay sequence.

At block 628, the device may determine a first length of the first Golay sequence or the second Golay sequence. At block 630, the device may determine a first weight vector having a second length, wherein the second length is based on the first length.

At block 632, the device may select a delay vector having a length equal to the second length of the first weight vector.

At block 634, the device may cause to send, by the communication circuitry, the first complementary Golay pair to a first station device, wherein the first complementary Golay pair is sent on the first spatial stream.

At block 636, the device may cause to send by the communication circuitry the second complementary Golay pair to the first station device, wherein the second complementary Golay pair is sent on the second spatial stream.

Figure 7:
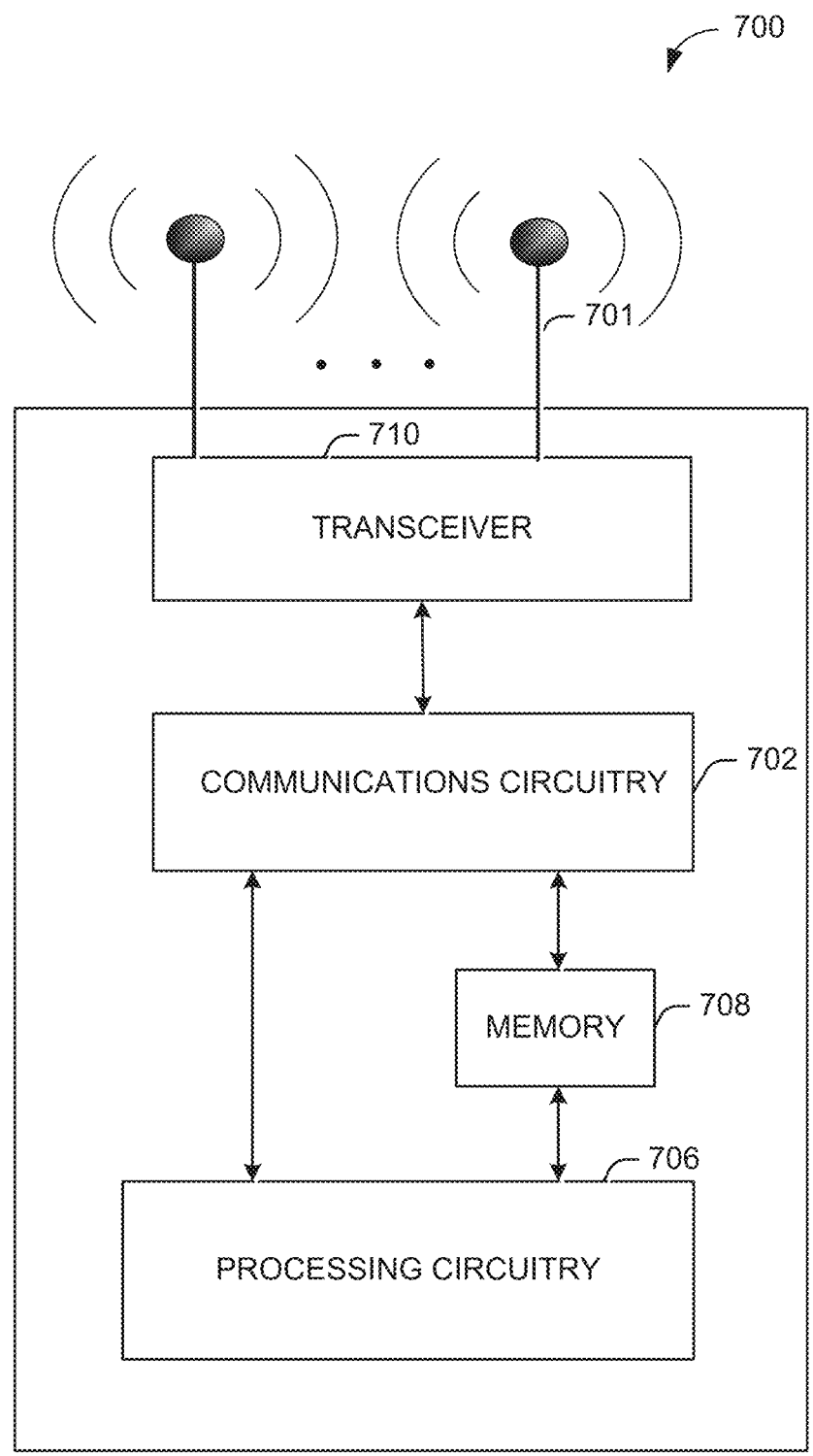
FIG. 7 illustrates a functional diagram of an example communication station that may be suitable for use as a user device, in accordance with one or more example embodiments of the disclosure.

FIG. 7 shows a functional diagram of an exemplary communication station 700 in accordance with some embodiments. In one embodiment, FIG. 7 illustrates a functional block diagram of a communication station that may be suitable for use as an AP 102 (FIG. 1) or a user device 120 (FIG. 1) in accordance with some embodiments. The communication station 700 may also be suitable for use as a handheld device, a mobile device, a cellular telephone, a smartphone, a tablet, a netbook, a wireless terminal, a laptop computer, a wearable computer device, a femtocell, a high data rate (HDR) subscriber station, an access point, an access terminal, or other personal communication system (PCS) device.

The communication station 700 may include communications circuitry 702 and a transceiver 710 for transmitting and receiving signals to and from other communication stations using one or more antennas 701. The communications circuitry 702 may include circuitry that can operate the physical layer (PHY) communications and/or media access control (MAC) communications for controlling access to the wireless medium, and/or any other communications layers for transmitting and receiving signals. The communication station 700 may also include processing circuitry 706 and memory 708 arranged to perform the operations described herein. In some embodiments, the communications circuitry 702 and the processing circuitry 706 may be configured to perform operations detailed in FIGS. 2, 3, 4, 5A, 5B, 6A, and 6B.

In accordance with some embodiments, the communications circuitry 702 may be arranged to contend for a wireless medium and configure frames or packets for communicating over the wireless medium. The communications circuitry 702 may be arranged to transmit and receive signals. The communications circuitry 702 may also include circuitry for modulation/demodulation, upconversion/downconversion, filtering, amplification, etc. In some embodiments, the processing circuitry 706 of the communication station 700 may include one or more processors. In other embodiments, two or more antennas 701 may be coupled to the communications circuitry 702 arranged for sending and receiving signals. The memory 708 may store information for configuring the processing circuitry 706 to perform operations for configuring and transmitting message frames and performing the various operations described herein. The memory 708 may include any type of memory, including non-transitory memory, for storing information in a form readable by a machine (e.g., a computer). For example, the memory 708 may include a computer-readable storage device, read-only memory (ROM), random-access memory (RAM), magnetic disk storage media, optical storage media, flash-memory devices and other storage devices and media.

In some embodiments, the communication station 700 may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), a wearable computer device, or another device that may receive and/or transmit information wirelessly.

In some embodiments, the communication station 700 may include one or more antennas 701. The antennas 701 may include one or more directional or omnidirectional antennas, including, for example, dipole antennas, monopole antennas, patch antennas, loop antennas, microstrip antennas, or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, the antennas may be effectively separated for spatial diversity and the different channel characteristics that may result between each of the antennas and the antennas of a transmitting station.

In some embodiments, the communication station 700 may include one or more of a keyboard, a display, a non-volatile memory port, multiple antennas, a graphics processor, an application processor, speakers, and other mobile device elements. The display may be an LCD screen including a touch screen.

Although the communication station 700 is illustrated as having several separate functional elements, two or more of the functional elements may be combined and may be implemented by combinations of software-configured elements, such as processing elements including digital signal processors (DSPs), and/or other hardware elements. For example, some elements may include one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements of the communication station 700 may refer to one or more processes operating on one or more processing elements.

Certain embodiments may be implemented in one or a combination of hardware, firmware, and software. Other embodiments may also be implemented as instructions stored on a computer-readable storage device, which may be read and executed by at least one processor to perform the operations described herein. A computer-readable storage device may include any non-transitory memory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. In some embodiments, the communication station 700 may include one or more processors and may be configured with instructions stored on a computer-readable storage device memory.

Figure 8:
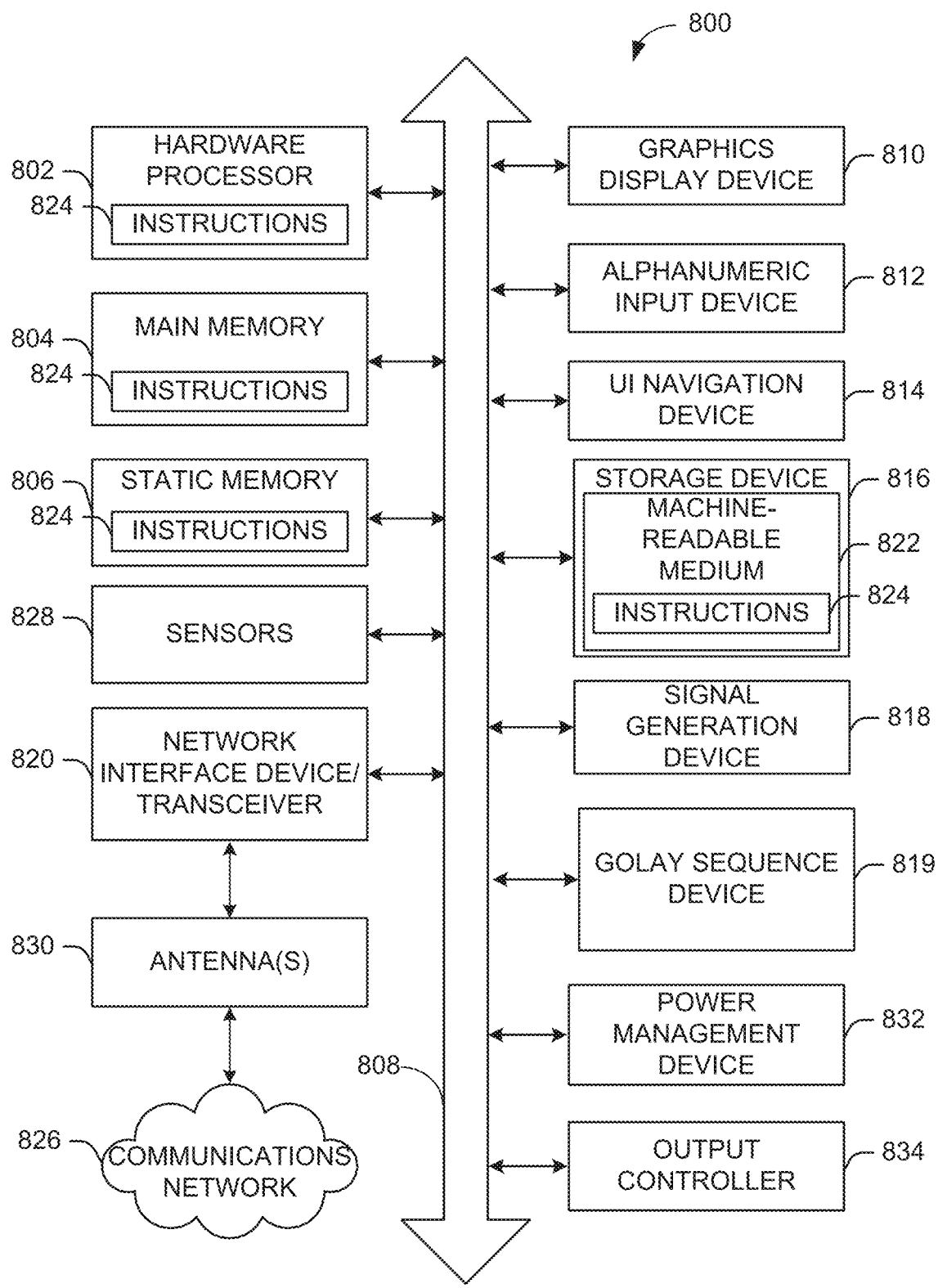
FIG. 8 shows a block diagram of an example machine upon which any of one or more techniques (e.g., methods) may be performed, in accordance with one or more embodiments of the disclosure.

FIG. 8 illustrates a block diagram of an example of a machine 800 or system upon which any one or more of the techniques (e.g., methodologies) discussed herein may be performed. In other embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environments. The machine 800 may be a personal computer (PC), a tablet PC, a set-top box (STB), a personal digital assistant (PDA), a mobile telephone, a wearable computer device, a web appliance, a network router, a switch or bridge, or any machine capable of executing instructions (sequential or otherwise) that specify actions to be taken by that machine, such as a base station. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), or other computer cluster configurations.

Examples, as described herein, may include or may operate on logic or a number of components, modules, or mechanisms. Modules are tangible entities (e.g., hardware) capable of performing specified operations when operating. A module includes hardware. In an example, the hardware may be specifically configured to carry out a specific operation (e.g., hardwired). In another example, the hardware may include configurable execution units (e.g., transistors, circuits, etc.) and a computer readable medium containing instructions where the instructions configure the execution units to carry out a specific operation when in operation. The configuring may occur under the direction of the executions units or a loading mechanism. Accordingly, the execution units are communicatively coupled to the computer-readable medium when the device is operating. In this example, the execution units may be a member of more than one module. For example, under operation, the execution units may be configured by a first set of instructions to implement a first module at one point in time and reconfigured by a second set of instructions to implement a second module at a second point in time.

The machine (e.g., computer system) 800 may include a hardware processor 802 (e.g., a central processing unit (CPU), a graphics processing unit (GPU), a hardware processor core, or any combination thereof), a main memory 804 and a static memory 806, some or all of which may communicate with each other via an interlink (e.g., bus) 808. The machine 800 may further include a power management device 832, a graphics display device 810, an alphanumeric input device 812 (e.g., a keyboard), and a user interface (UI) navigation device 814 (e.g., a mouse). In an example, the graphics display device 810, alphanumeric input device 812, and UI navigation device 814 may be a touch screen display. The machine 800 may additionally include a storage device (i.e., drive unit) 816, a signal generation device 818 (e.g., a speaker), a Golay sequence device 819, a network interface device/transceiver 820 coupled to antenna(s) 830, and one or more sensors 828, such as a global positioning system (GPS) sensor, a compass, an accelerometer, or other sensor. The machine 800 may include an output controller 834, such as a serial (e.g., universal serial bus (USB), parallel, or other wired or wireless (e.g., infrared (IR), near field communication (NFC), etc.) connection to communicate with or control one or more peripheral devices (e.g., a printer, a card reader, etc.)).

The storage device 816 may include a machine readable medium 822 on which is stored one or more sets of data structures or instructions 824 (e.g., software) embodying or utilized by any one or more of the techniques or functions described herein. The instructions 824 may also reside, completely or at least partially, within the main memory 804, within the static memory 806, or within the hardware processor 802 during execution thereof by the machine 800.

In an example, one or any combination of the hardware processor 802, the main memory 804, the static memory 806, or the storage device 816 may constitute machine-readable media.

The Golay Sequence Device 819 may carry out or perform any of the operations and processes (e.g., processes 200, 600 and 601) described and shown above. For example, the Golay Sequence Device 719 may be configured to identify a Golay pair; determine a plurality of weight vectors associated with the Golay pair; cause to search for a fixed delay vector associated with the Golay pair over the plurality of weight vectors associated with the Golay pair; generate GSSs based at least in part on the search; determine a first subset of GSSs, the first subset comprising a reduced orthogonal sequence subset of the GSSs; determine a second subset of GSSs based at least in part on the first subset; and determine a third subset of GSSs from the generated GSSs, the third subset comprising GSSs that have a ZCC property; and determine a fourth subset of the GSSs by adding the third subset of the GSSs to the second subset of GSSs. The Golay Sequence Device 819 may further determine a short training field (STF) from the fourth subset of GSSs; and cause to send the STF to a second device.

It is understood that the above are only a subset of what the Golay Sequence Device 819 may be configured to perform and that other functions included throughout this disclosure may also be performed by the Golay Sequence Device 819.

While the machine-readable medium 822 is illustrated as a single medium, the term "machine-readable medium" may include a single medium or multiple media (e.g., a centralized or distributed database, and/or associated caches and servers) configured to store the one or more instructions 824.

Various embodiments may be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

The term "machine-readable medium" may include any medium that is capable of storing, encoding, or carrying instructions for execution by the machine 800 and that cause the machine 800 to perform any one or more of the techniques of the present disclosure, or that is capable of storing, encoding, or carrying data structures used by or associated with such instructions. Non-limiting machine-readable medium examples may include solid-state memories and optical and magnetic media. In an example, a massed machine-readable medium includes a machine-readable medium with a plurality of particles having resting mass. Specific examples of massed machine-readable media may include non-volatile memory, such as semiconductor memory devices (e.g., electrically programmable read-only memory (EPROM), or electrically erasable programmable read-only memory (EEPROM)) and flash memory devices; magnetic disks, such as internal hard disks and removable disks; magneto-optical disks; and CD-ROM and DVD-ROM disks.

The instructions 824 may further be transmitted or received over a communications network 826 using a transmission medium via the network interface device/transceiver 820 utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Internet), mobile telephone networks (e.g., cellular networks), plain old telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, the network interface device/transceiver 820 may include one or more physical jacks (e.g., Ethernet, coaxial, or phone jacks) or one or more antennas to connect to the communications network 826. In an example, the network interface device/transceiver 820 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 800 and includes digital or analog communications signals or other intangible media to facilitate communication of such software. The operations and processes (e.g., processes 200, 600, and 601) described and shown above may be carried out or performed in any suitable order as desired in various implementations. Additionally, in certain implementations, at least a portion of the operations may be carried out in parallel. Furthermore, in certain implementations, less than or more than the operations described may be performed.

The word "exemplary" is used herein to mean "serving as an example, instance, or illustration." Any embodiment described herein as "exemplary" is not necessarily to be construed as preferred or advantageous over other embodiments. The terms "computing device", "user device", "communication station", "station", "handheld device", "mobile device", "wireless device" and "user equipment" (UE) as used herein refers to a wireless communication device such as a cellular telephone, smartphone, tablet, netbook, wireless terminal, laptop computer, a femtocell, High Data Rate (HDR) subscriber station, access point, printer, point of sale device, access terminal, or other personal communication system (PCS) device. The device may be either mobile or stationary.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as 'communicating', when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

The term "access point" (AP) as used herein may be a fixed station. An access point may also be referred to as an access node, a base station, or some other similar terminology known in the art. An access terminal may also be called a mobile station, user equipment (UE), a wireless communication device, or some other similar terminology known in the art. Embodiments disclosed herein generally pertain to wireless networks. Some embodiments can relate to wireless networks that operate in accordance with one of the IEEE 802.11 standards.

Some embodiments may be used in conjunction with various devices and systems, for example, a Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some embodiments may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some embodiments may be used in conjunction with one or more types of wireless communication signals and/or systems following one or more wireless communication protocols, for example, Radio Frequency (RF), Infra Red (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other embodiments may be used in various other devices, systems, and/or networks.

According to example embodiments of the disclosure, there may be a device. The device can comprise: memory and processing circuitry, configured to: identify a Golay pair, determine a plurality of weight vectors associated with the Golay pair; cause to search for a fixed delay vector associated with the Golay pair over the plurality of weight vectors associated with the Golay pair; generate Golay Sequence Sets (GSSs) based at least in part on the search; determine a short training field (STF) based at least in part on a subset of the GSSs; and cause to send the STF to a second device.

Implementation may include one or more of the following features. The processing circuitry may be further configured to: determine a first subset of GSSs, the first subset comprising a reduced orthogonal sequence subset of the GSSs, determine a second subset of GSSs based at least in part on the first subset, and determine a third subset of GSSs from the generated GSSs, the third subset comprising GSSs that have a zero cross correlation property. The processing circuitry may be further configured to: execute instructions to determine the subset of the GSSs by adding the third subset of the GSSs to the second subset of GSSs. The processing circuitry may be further configured to: execute instructions to determine a channel estimation field (CEF) from the subset of GSSs. The subset of GSSs may have a length of 128, 256, or 512 symbols. The Golay pair may satisfy a complementary property wherein a sum of autocorrelation functions associated with the Golay pair is equal to unity and the Golay pair may be determined based at least in part on at least one legacy communication standard. The device may further comprise a transceiver configured to transmit and receive wireless signals and an antenna coupled to the transceiver.

According to example embodiments of the disclosure, there may be a non-transitory computer-readable medium. The non-transitory computer-readable medium may store computer-executable instructions which, when executed by a processor, may cause the processor to perform operations comprising: identifying a Golay pair, determining a plurality of weight vectors associated with the Golay pair; causing to search for a fixed delay vector associated with the Golay pair over the plurality of weight vectors associated with the Golay pair; generating Golay Sequence Sets (GSSs) based at least in part on the search; determine a short training field (STF) based at least in part on a subset of the GSSs; and cause to send the STF to a second device.

Implementation may include one or more of the following features. The medium may perform operations further comprising: determining a first subset of GSSs, the first subset comprising a reduced orthogonal sequence subset of the GSSs, determining a second subset of GSSs based at least in part on the first subset, and determining a third subset of GSSs from the generated GSSs, the third subset comprising GSSs that have a zero cross correlation property. Operations may further comprise determining the subset of the GSSs by adding the third subset of the GSSs to the second subset of GSSs and may further comprise determining a channel estimation field (CEF) from the subset of GSSs. The subset of GSSs may have a length of 128, 256, or 512 symbols. The Golay pair may satisfy a complementary property wherein a sum of autocorrelation functions associated with the Golay pair is equal to unity and the Golay pair may be determined based at least in part on at least one legacy communication standard.

According to example embodiments of the disclosure, there may be a method. The method may comprise: identifying a Golay pair, determining a plurality of weight vectors associated with the Golay pair; causing to search for a fixed delay vector associated with the Golay pair over the plurality of weight vectors associated with the Golay pair; generating Golay Sequence Sets (GSSs) based at least in part on the search; determine a short training field (STF) based at least in part on a subset of the GSSs; and cause to send the STF to a second device.

Implementation may include one or more of the following features. The method may perform operations further comprising: determining a first subset of GSSs, the first subset comprising a reduced orthogonal sequence subset of the GSSs, determining a second subset of GSSs based at least in part on the first subset, and determining a third subset of GSSs from the generated GSSs, the third subset comprising GSSs that have a zero cross correlation property. Operations may further comprise determining the subset of the GSSs by adding the third subset of the GSSs to the second subset of GSSs and may further comprise determining a channel estimation field (CEF) from the subset of GSSs. The subset of GSSs may have a length of 128, 256, or 512 symbols. The Golay pair may satisfy a complementary property wherein a sum of autocorrelation functions associated with the Golay pair is equal to unity and the Golay pair may be determined based at least in part on at least one legacy communication standard.

According to example embodiments of the disclosure, there may be a method. The method may perform operations comprising: establishing one or more multiple-input and multiple-output (MIMO) communication channels between a device and a second device; receiving a short training field (STF) from the second device for channel estimation in a time domain or frequency domain; determining first information based at least in part on the received one or more STFs; and sending, to the second device, the first information.

According to example embodiments of the disclosure, there may be an apparatus. The apparatus may further comprise means for: identifying a Golay pair, determining a plurality of weight vectors associated with the Golay pair; causing to search for a fixed delay vector associated with the Golay pair over the plurality of weight vectors associated with the Golay pair; generating Golay Sequence Sets (GSSs) based at least in part on the search; determine a short training field (STF) based at least in part on a subset of the GSSs; and cause to send the STF to a second device.

Implementation may include one or more of the following features. The apparatus may perform operations further comprising means for: determining a first subset of GSSs, the first subset comprising a reduced orthogonal sequence subset of the GSSs, determining a second subset of GSSs based at least in part on the first subset, and determining a third subset of GSSs from the generated GSSs, the third subset comprising GSSs that have a zero cross correlation property. Operations may further comprise means for determining the subset of the GSSs by adding the third subset of the GSSs to the second subset of GSSs and may further comprise means for determining a channel estimation field (CEF) from the subset of GSSs. The subset of GSSs may have a length of 128, 256, or 512 symbols. The Golay pair may satisfy a complementary property wherein a sum of autocorrelation functions associated with the Golay pair is equal to unity and the Golay pair may be determined based at least in part on at least one legacy communication standard.

According to example embodiments of the disclosure, there may be a device. The device may have at least one memory that stores computer-executable instructions. One processor of the one or more processors may be configured to access the at least one memory, wherein the at least one processor of the one or more processors may be configured to execute the computer-executable instructions to: establish one or more multiple-input and multiple-output (MIMO) communication channels between a device and a second device; receive a short training field (STF) from the second device for channel estimation in a time domain or frequency domain; determine first information based at least in part on the received one or more STFs; and send, to the second device, the first information.

According to example embodiments of the disclosure, there may be a non-transitory computer-readable medium. The non-transitory computer-readable medium may store computer-executable instructions which, when executed by a processor, may cause the processor to perform operations comprising: establishing one or more multiple-input and multiple-output (MIMO) communication channels between a device and a second device; receiving a short training field (STF) from the second device for channel estimation in a time domain or frequency domain; determining first information based at least in part on the received one or more STFs; and sending, to the second device, the first information.

According to example embodiments of the disclosure, there may be an apparatus. The apparatus may perform operations comprising means for: establishing one or more multiple-input and multiple-output (MIMO) communication channels between a device and a second device; receiving a short training field (STF) from the second device for channel estimation in a time domain or frequency domain; determining first information based at least in part on the received one or more STFs; and sending, to the second device, the first information.

Certain aspects of the disclosure are described above with reference to block and flow diagrams of systems, methods, apparatuses, and/or computer program products according to various implementations. It will be understood that one or more blocks of the block diagrams and flow diagrams, and combinations of blocks in the block diagrams and the flow diagrams, respectively, can be implemented by computer-executable program instructions. Likewise, some blocks of the block diagrams and flow diagrams may not necessarily need to be performed in the order presented, or may not necessarily need to be performed at all, according to some implementations.

These computer-executable program instructions may be loaded onto a special-purpose computer or other particular machine, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable storage media or memory that can direct a computer or other programmable data processing apparatus to function in a particular manner, such that the instructions stored in the computer-readable storage media produce an article of manufacture including instruction means that implement one or more functions specified in the flow diagram block or blocks. As an example, certain implementations may provide for a computer program product, comprising a computer-readable storage medium having a computer-readable program code or program instructions implemented therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

What is claimed is:

1. A device for generating complementary Golay pairs, the device comprising processing circuitry and communication circuitry, the processing circuitry coupled to communication circuitry, the communication circuitry operates a physical layer (PHY) communication to cause to send the complementary Golay pairs, and the processing circuitry configured to:

determine a first complementary Golay pair of complementary Golay pairs, wherein the first complementary Golay pair comprises a first Golay sequence and a second Golay sequence, wherein the first complementary Golay pair is associated with a first spatial stream of spatial streams;

determine a second complementary Golay pair of the complementary Golay pairs, wherein the second complementary Golay pair comprises a third Golay sequence and a fourth Golay sequence, wherein the second complementary Golay pair is associated with a second spatial stream of the spatial streams;

determine the first Golay sequence having the same number of positive elements as the number of positive elements of the second Golay sequence and having the same number of negative elements as the number of negative elements of the second Golay sequence;

determine a first length of the first Golay sequence or the second Golay sequence;

determine a first weight vector having a second length, wherein the second length is based on the first length;

select a delay vector having a length equal to the second length of the first weight vector;

cause to send, by the communication circuitry, the first complementary Golay pair to a first station device, wherein the first complementary Golay pair is sent on the first spatial stream; and cause to send by the communication circuitry the second complementary Golay pair to the first station device, wherein the second complementary Golay pair is sent on the second spatial stream.

2. The device of claim 1, wherein the first weight vector is a sequence of one or more of +1 and −1 values.

3. The device of claim 1, determine the first Golay sequence is made up of a first number of +1 values and a second number of −1 values.

4. The device of claim 1, determine the second Golay sequence is made up of a third number of +1 values and a fourth number of −1 values.

5. The device of claim 1, wherein the processing circuitry is further configured to determine the delay vector is the same for the spatial streams.

6. The device of claim 1, wherein the first size of the first complementary Golay pair is equal to 128, 256, or 512.

7. The device of claim 1, wherein the second size of the first weight vector is equal to 7, 8, or 9.

8. The device of claim 1, wherein the first complementary Golay pair and the second complementary Golay pair have a zero cross correlation property.

9. The device of claim 1, further comprising a transceiver configured to transmit and receive wireless signals.

10. The device of claim 9, further comprising a plurality of antennas associated with the spatial streams, wherein the plurality of antennas are coupled to the transceiver.

11. A non-transitory computer-readable medium storing computer-executable instructions which when executed by one or more processors result in performing operations comprising:

determining a first complementary Golay pair of complementary Golay pairs, wherein the first complementary Golay pair comprises a first Golay sequence and a second Golay sequence, wherein the first complementary Golay pair is associated with a first spatial stream of spatial streams;

determining a second complementary Golay pair of the complementary Golay pairs, wherein the second complementary Golay pair comprises a third Golay sequence and a fourth Golay sequence, wherein the second complementary Golay pair is associated with a second spatial stream of the spatial streams;

determining the first Golay sequence having the same number of positive elements as the number of positive elements of the second Golay sequence and having the same number of negative elements as the number of negative elements of the second Golay sequence;

determining a first length of the first Golay sequence or the second Golay sequence;

determining a first weight vector having a second length, wherein the second length is based on the first length;

selecting a delay vector having a length equal to the second length of the first weight vector;

causing to send the first complementary Golay pair to a first station device, wherein the first complementary Golay pair is sent on the first spatial stream; and causing to send the second complementary Golay pair to the first station device, wherein the second complementary Golay pair is sent on the second spatial stream.

12. The non-transitory computer-readable medium of claim 11, wherein the first weight vector is a sequence of one or more of +1 and −1 values.

13. The non-transitory computer-readable medium of claim 11, determine the first Golay sequence is made up of a first number of +1 values and a second number of −1 values.

14. The non-transitory computer-readable medium of claim 11, determine the second Golay sequence is made up of a third number of +1 values and a fourth number of −1 values.

15. The non-transitory computer-readable medium of claim 11, wherein the operations further comprise determine the delay vector is the same for the spatial streams.

16. The non-transitory computer-readable medium of claim 11, wherein the first size of the first complementary Golay pair is equal to 128, 256, or 512.

17. The non-transitory computer-readable medium of claim 11, wherein the second size of the first weight vector is equal to 7, 8, or 9.

18. The non-transitory computer-readable medium of claim 11, wherein the first complementary Golay pair and the second complementary Golay pair have a zero cross correlation property.

19. A method comprising:

determining, by one or more processors, a first complementary Golay pair of complementary Golay pairs, wherein the first complementary Golay pair comprises a first Golay sequence and a second Golay sequence, wherein the first complementary Golay pair is associated with a first spatial stream of spatial streams;

determining a second complementary Golay pair of the complementary Golay pairs, wherein the second complementary Golay pair comprises a third Golay sequence and a fourth Golay sequence, wherein the second complementary Golay pair is associated with a second spatial stream of the spatial streams;

determining the first Golay sequence having the same number of positive elements as the number of positive elements of the second Golay sequence and having the same number of negative elements as the number of negative elements of the second Golay sequence;

determining a first length of the first Golay sequence or the second Golay sequence;

determining a first weight vector having a second length, wherein the second length is based on the first length;

selecting a delay vector having a length equal to the second length of the first weight vector;

causing to send the first complementary Golay pair to a first station device, wherein the first complementary Golay pair is sent on the first spatial stream; and causing to send the second complementary Golay pair to the first station device, wherein the second complementary Golay pair is sent on the second spatial stream.

20. The method of claim 19, wherein the first weight vector is a sequence of one or more of +1 and −1 values.

* * * * *